(12) United States Patent
Dahlfort

(10) Patent No.: US 12,044,891 B2
(45) Date of Patent: Jul. 23, 2024

(54) THERMALLY RESISTANT REMOTE RADIO UNIT

(71) Applicant: Telefonaktiebolaget LM Ericsson (publ), Stockholm (SE)

(72) Inventor: Stefan Dahlfort, Los Gatos, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 317 days.

(21) Appl. No.: 17/621,868

(22) PCT Filed: Jul. 3, 2019

(86) PCT No.: PCT/SE2019/050663
§ 371 (c)(1),
(2) Date: Dec. 22, 2021

(87) PCT Pub. No.: WO2021/002787
PCT Pub. Date: Jan. 7, 2021

(65) Prior Publication Data
US 2022/0244476 A1  Aug. 4, 2022

(51) Int. Cl.
*G02B 6/42* (2006.01)
*H05K 7/20* (2006.01)

(52) U.S. Cl.
CPC ......... *G02B 6/4269* (2013.01); *G02B 6/4246* (2013.01); *H05K 7/20336* (2013.01)

(58) Field of Classification Search
CPC . G02B 6/4269; G02B 6/4246; H05K 7/20336
See application file for complete search history.

(56) References Cited

U.S. PATENT DOCUMENTS 10,283,849 B2 * 5/2019 Hirata .................. H04B 1/38
2010/0027220 A1   2/2010 Hughes et al.
(Continued)

OTHER PUBLICATIONS

Author Unknown, "Heat pipe," Wikipedia, en.wikipedia.org/wiki/Heat_pipe, accessed Jul. 1, 2019, 11 pages.
(Continued)

*Primary Examiner* — Michael P Mooney
(74) *Attorney, Agent, or Firm* — Withrow & Terranova, PLLC

(57) ABSTRACT

A remote radio unit, RRU, has an outer shell housing radio equipment and at least one fiber optical transceiver module. The fiber optical transceiver module comprises, a casing provided with an interface having a transmitter output, and a Transmitter Optical Sub-Assembly, TOSA, arranged within said casing, where said TOSA transmits light through said transmitter output. The fiber optical transceiver module is physically attached to a heat transferring structure adapted to transfer heat generated in said fiber optical transceiver module to a heat sink arranged outside said outer shell. The proposed technology also provides a fiber optical transceiver module comprising a casing provided with an interface having a transmitter output and a TOSA arranged within said casing and adapted to transmit light through said transmitter output, wherein said casing is further provided with thermal pads arranged on the surface of said casing, said thermal pads may connect to a thermal conductor.

10 Claims, 8 Drawing Sheets

(56) References Cited

U.S. PATENT DOCUMENTS

| 2015/0013936 | A1* | 1/2015 | Mack | F28F 1/32 |
| | | | | 165/53 |
| 2017/0150645 | A1* | 5/2017 | Huang | H05K 5/0026 |
| 2018/0034492 | A1 | 2/2018 | Edgren et al. | |

OTHER PUBLICATIONS

Author Unknown, "TEC Combined With Gravity Heat Pipe Solution," Research Disclosure, vol. 619, Issue 24, Nov. 2015, 5 pages.
Author Unknown, "Wakefield-Vette 110578," Product Information Page, Mouser Electronics, Inc., 2019, 2 pages.
International Search Report and Written Opinion for International Patent Application No. PCT/SE2019/050663, mailed Mar. 24, 2020, 10 pages.

* cited by examiner

THERMALLY RESISTANT REMOTE RADIO UNIT

This application is a 35 U.S.C. § 371 national phase filing of International Application No. PCT/SE2019/050663, filed Jul. 3, 2019, the disclosure of which is incorporated herein by reference in its entirety.

TECHNICAL FIELD

The proposed technology relates to a remote radio unit provided with fiber optical transceiver modules. It also relates to a fiber optical transceiver module to be used with a remote radio unit.

BACKGROUND

A remote radio unit, RRU, also referred to as a remote radio head, RRH, is a remote radio transceiver, which is part on an overall radio base station. The RRU has a wireless interface to User Equipment's, UEs, with wireless technologies such as GSM, CDMA, UMTS, LTE. The radio transceiver is remote to the base station equipments such as BTS, NodeB, eNodeB or gNodeB for 2G, 3G, 4G and 5G, respectively. Such equipments are sometimes referred to as basebands. The RRU simplifies the deployment of radio networks since it is connected to the baseband using a lightweight fiber rather than heavy coax cable, thus much easier to install in tall masts for example.

The RRU fiber optic connection to the baseband is commonly using the Common Public Radio Interface protocols, CPRI protocols. Remote Radio units have become one of the most important subsystems of today's new distributed base stations. The RRU may contain equipment for transmission and reception. The transmit equipment for example usually comprises a Digital to Analog Converter, DAC, a mixer, a power amplifier and various filters. The receiving equipment may comprise a filter, a low noise amplifier, a mixer and an Analog to Digital Converter, ADC. The RRU thus contains the base stations RF circuitry plus analog-to-digital/digital-to-analog converters and up/down converters, the components comprised in the RRU will be referred to as radio equipment in the present disclosure. RRUs also have operation and management processing capabilities and a standardized optical interface to connect to the rest of the base station, i.e., the CPRI protocols as stated above. RRUs simplify MIMO operation since they increase a base stations efficiency and facilitate easier physical location for gap coverage problems. The components comprised in the RRU will be referred to generally as radio equipment in the present disclosure.

FIG. 1 provides a schematic illustration of an environment where an RRU are used. It is disclosed how an RRU 1 is mounted in the vicinity of the antenna 51 of a base station 50 in order to reduce possible transmission losses. The RRU 1 is connected to the base band unit 56 via an optical fiber 13. The base band 56 serves several UEs, collectively denoted by reference number 500, connected to the RRU via the antenna.

A common design of an RRU 1 comprises a fiber optical transceiver module that is dedicated to perform at least part of the optical communication. An alternative to this is an RRU that can be connected, in a removable fashion, to a corresponding optical pluggable device that comprises components that enables optical communication based on optical signals transmitted through optical fibers. The optical signals are converted to electronic signals by an optical transceiver before they are further processed and decoded. Modern day optical transceivers often have a modular design with specified physical dimensions as determined by standard electrical interface agreements and standard optical interface agreements, this is also the case for the physical and mechanical dimensions of optical pluggables which are often specified at least in public specification in industry multi-source agreements. The Small Form Factor multi-source agreement is one particular standard agreement, SFP MSA. In this document, the term "SFP" will be used interchangeable for optical pluggable in general, e.g. SFP, SFP+, QSFP+ etc.

A fiber optical transceiver module may comprise one or several optical components, generally referred to as optical sub-assemblies. There is one set of optical components that are adapted to convert optical signals into electrical signals, while the opposite, i.e., the conversion of electrical signals into optical signals are performed by another set of optical components. These components are commonly known as receivers and transmitters, and typically implemented by photo diodes and lasers, respectively. A fiber optical transceiver module is a module that comprises both transmitters and receiver components, but it is possible to have a module with only a transmitter or receiver. For example, in the case where optical signals are carried on two distinct optical fibers, one for transmission and one for reception, then it is necessary that the fiber optical transceiver module contains these two optical transceiver components. In the case the fiber optical transceiver module is required to use a single fiber for the two directions, a so-called diplexer filter is needed in front of the transmitter and receiver components, to separate the light propagating in the two directions. The present technology applies to all of these various transceiver modules.

It should in particular be noted that an optical transceiver component generally comprises a transmitter optical sub-assembly, TOSA for transmission, and a receiver optical sub-assembly, ROSA, for reception. A TOSA is an optical device that converts an electrical signal into an optical signal. A TOSA comprises a laser diode, an optical interface, a monitor photodiode, a housing, plastic and/or metallic, and also an electrical interface. It may also comprise additional components such as filter elements and isolators. By utilizing the components, the TOSA is able to convert the electrical signal into an optical ditto that is regularly coupled to an optical fiber cable. A ROSA comprises at least a photodiode, an optical interface, metal and/or plastic housing, and electrical interface, other components may be present as well including amplifiers. It is used to receive an optical signal from a fiber and convert it back into an electrical signal. For bi-directional transmission of a single fiber, a bi-directional optical subassembly, BOSA, includes both a TOSA and a ROSA and the diplexer filter.

Due to the importance of an RRU for implementing the radio coverage of a base station there is an ongoing need to improve the performance of the RRU. The proposed technology provides an RRU design having improved performance characteristics even when working in a highly heat generating mode.

SUMMARY

It is an object of the proposed technology to provide a design for an RRU that comprises radio equipment and fiber optical transceiver module(s) with improved performance characteristics, in particular during active sessions when a lot of heat is generated in and around the fiber optical transceiver module.

It is another object of the proposed technology to provide a fiber optical transceiver module that can be used by a remote radio unit, and in particular a pluggable fiber optical transceiver module.

These and other objects are met by embodiments of the proposed technology. According to a first aspect of the proposed technology there is provided a remote radio unit having an outer shell housing radio equipment and at least one fiber optical transceiver module. The fiber optical transceiver module comprises a casing provided with an interface having a transmitter output. The fiber optical transceiver module also comprises a Transmitter Optical Sub-Assembly, TOSA arranged within the casing, and being adapted to transmit light through the transmitter output. The fiber optical transceiver module is physically attached to a heat transferring structure that is adapted to transfer heat generated in the fiber optical transceiver module to a heat sink arranged outside the outer shell.

According to a second aspect of the proposed technology there is provided a fiber optical transceiver module comprising a casing provided with an interface having a transmitter output and a Transmitter Optical Sub-Assembly, TOSA, arranged within the casing and adapted to transmit light through the transmitter output. The casing is further provided with thermal pads arranged on the surface of the casing and being adapted to connect to a thermal conductor.

Embodiments of the proposed technology ascertain that the RRU works efficiently even under circumstances where a lot of heat is generated in the fiber optical transceiver module and/or from the rest of the RRU components surrounding the optical transceiver. The proposed technology enables beside an improved overall system performance, a more efficient use of the laser in the fiber optical transceiver module as the output power and signal quality may degrade with high temperature. The particular RRU design also increases the life span of the components within the RRU since excessive heat that acts degrading on the components are removed from the RRU.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which.

DETAILED DESCRIPTION

Figure 1:
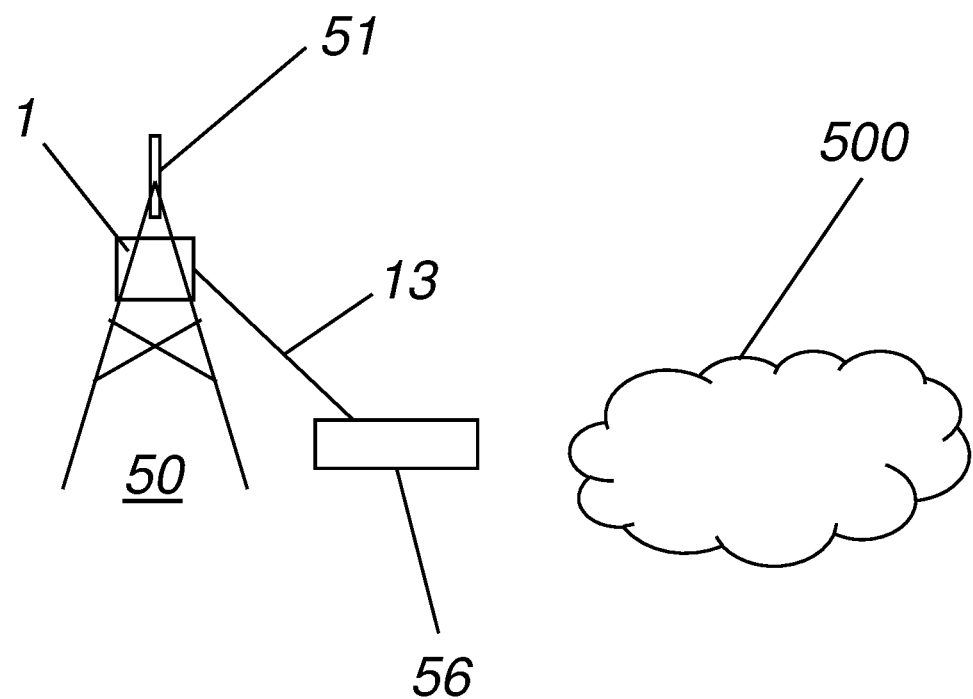
FIG. 1 is a schematic illustration of a radio base band connected to a Remote Radio Unit, RRU.

Throughout the drawings, the same reference designations are used for similar or corresponding elements. Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

For a better understanding of the proposed technology, it may be useful to begin with a brief system overview and/or analysis of the technical problem. To this end reference is made to FIG. 2 which provide a schematic illustration of an RRU that comprises radio equipment and at least one fiber optical transceiver module housed within a single casing. Disclosed is an RRU 1 comprising an outer shell 10 housing various radio equipment 50 and at least one fiber optical transceiver module 100. The fiber optical transceiver module 100 comprises a casing 101 provided with an interface 103 having a transmitter output 102, e.g., a laser output. The fiber optical transceiver module 100 also comprises a Transmitter Optical Sub-Assembly, TOSA, 200 arranged within the casing 101. The TOSA 200 being adapted to transmit light through the transmitter output 102. Sub-components of the radio equipment and the TOSA are not shown.

Figure 2:
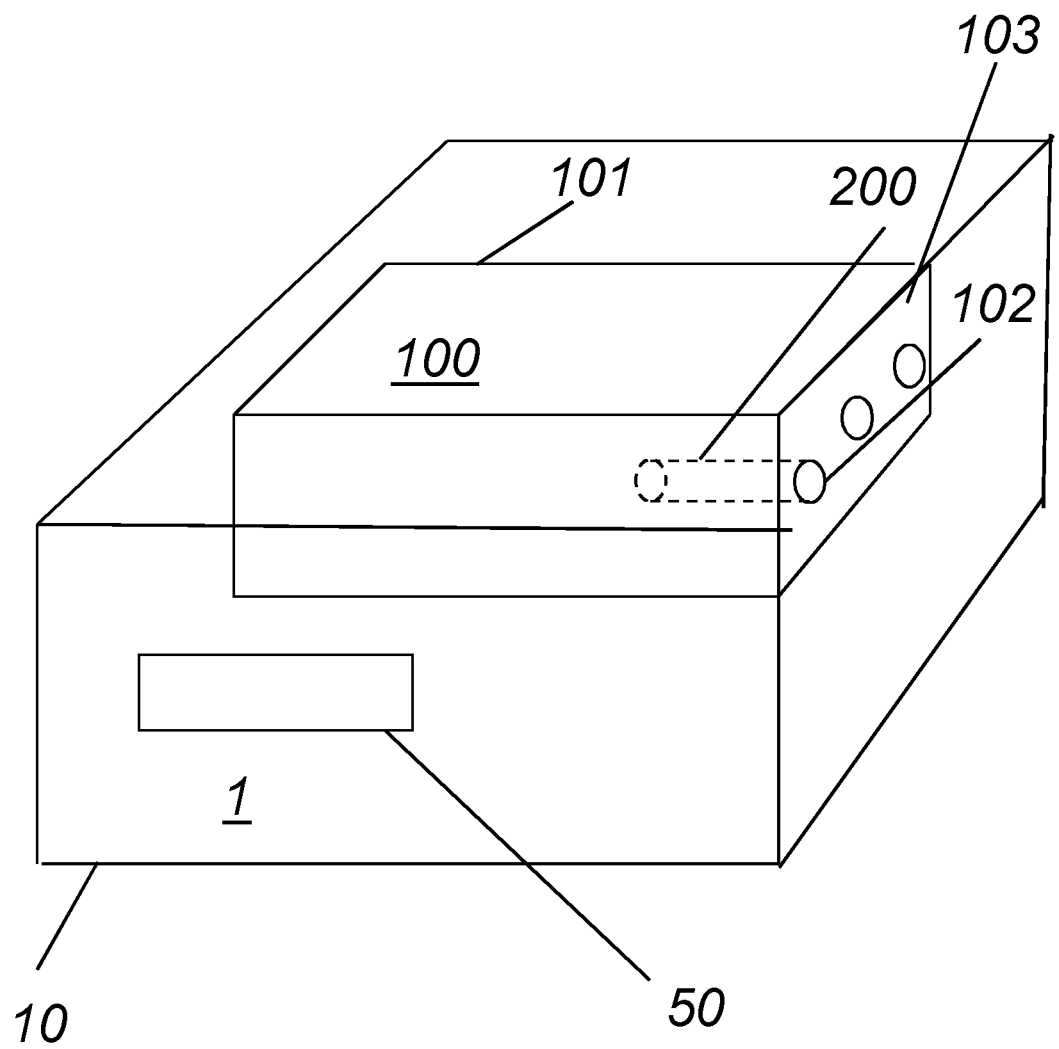
FIG. 2 is a schematic illustration of an RRU comprising a fiber optical transceiver module.

During use of an RRU according to FIG. 2, the fiber optical transceiver module will generate a lot of heat, due to the work that is performed by the various components in the module such as the ASICs and the laser component in the TOSA. The inventor has realized that this heat will negatively affect the laser of the TOSA. This might lead to a decrease in the overall system performance. There is moreover an ongoing need in modern radio products to increase the functionality in devices with smaller form factors. This is particular true for RRUs as well as in so called small form-factor pluggables, SFPs, which are pluggable fiber optical module transceiver that are commonly used in those RRUs. The increased demand put on the functionality of these RRU and transceiver modules require that more and more components are provided within an already constrained volume, the heat generated by some these components during their active mode may negatively affect other components that are arranged in close spatially proximity. The generated heat may in in particular affect the fiber optical transceiver modules that provides the communication between radio and baseband systems. The laser of such a fiber optical transceiver module may display a reduced output power due to the negative effect of excessive heat produced in the small area hoisting the laser, thus jeopardizing system performance. The life span of the laser may also be shortened due to the heat it is subjected to.

There have been several attempts made to improve the heat resistance of a fiber optical transceiver module. One attempt has been to transfer heat from the hot electronics or optics to a surrounding cooler place, like the outside metal housing of the box or blade, see US 2018034492 and US 2010027220. The proposed technology aims to improve the performance of an RRU that comprises, or houses, fiber optical transceiver modules and the mechanisms proposed in US2018034492 and US2010027220 are insufficient for this purpose since they only transfer the heat to the casing of the fiber optical transceiver modules. This only increases the temperature within the already hot RRU.

Hence, in order to counter the problems with excessive heat in an RRU comprising a fiber optical transceiver module the proposed technology offers an RRU design that enables an efficient removal of heat both from module but also from all working components present in the RRU.

Figure 3:
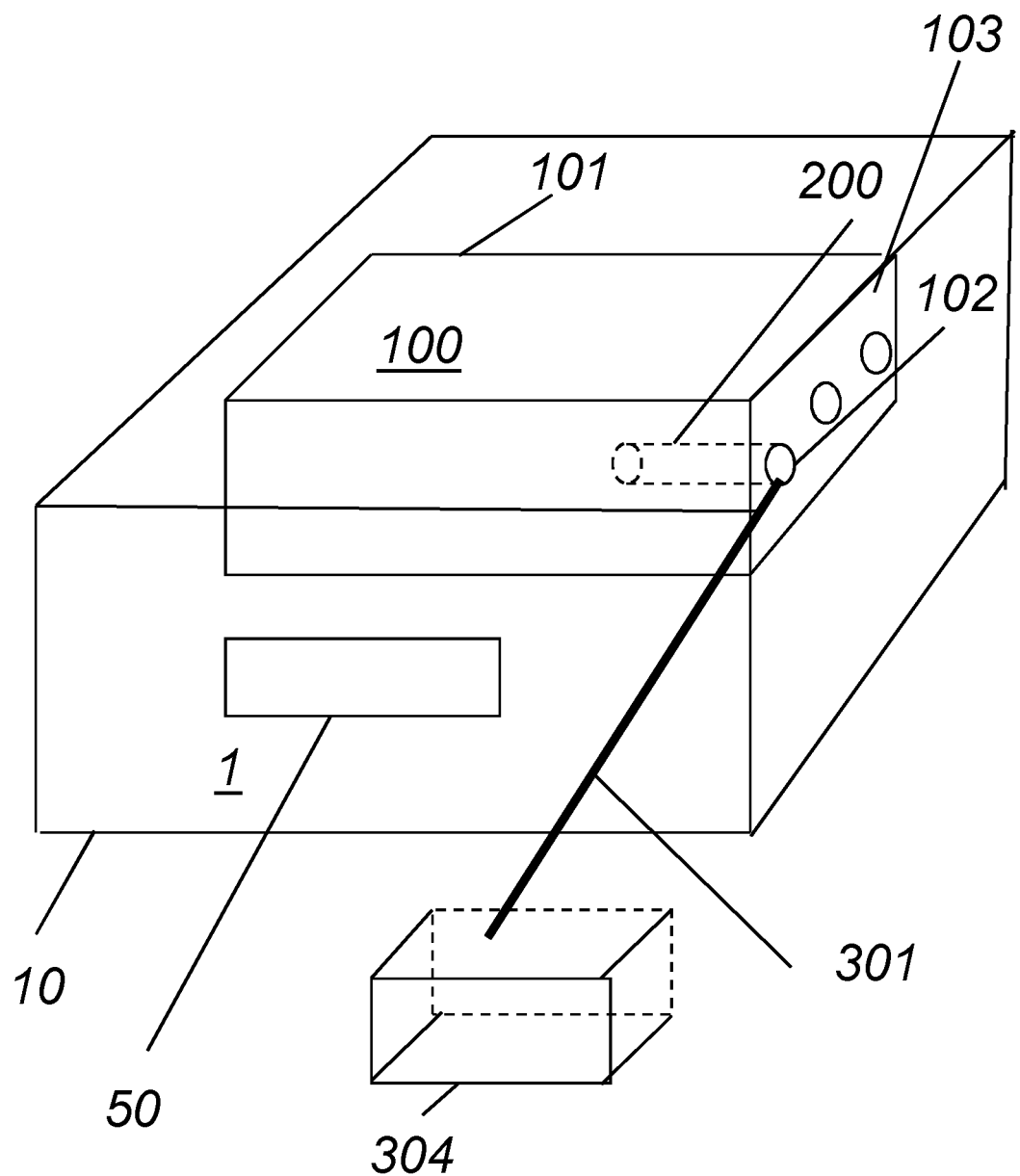
FIG. 3 is a schematic illustration of an RRU comprising a fiber optical transceiver module according to the proposed technology.

FIG. 3 is a schematic illustration of a remote radio unit 1 according to the proposed technology. The RRU has an outer shell 10 housing radio equipment and at least one fiber optical transceiver module 10. The fiber optical transceiver module 100 comprises a casing 101 provided with an interface 103 having a transmitter output 102. The fiber optical transceiver module 100 also comprises a Transmitter Optical Sub-Assembly, TOSA, 200 arranged within the casing 101, the TOSA 200 being adapted to transmit light through the transmitter output 102. The fiber optical transceiver module 100 is physically attached to a heat transferring structure 301 adapted to transfer heat generated in the fiber optical transceiver module 100 to a heat sink 304 arranged outside the outer shell 10 of the RRU.

The proposed RRU acts to lower the laser temperature of the laser in the fiber optical transceiver module by transferring the generated heat to a heatsink. The heat is transferred not to a heatsink that is only external to the module but instead to heatsink arranged outside the RRU itself. This solves the problem of cooling the fiber optical transceiver module, and it also enables an overall cooling of the RRU since the heatsink is arranged externally to the RRU. Compared to designs where the heat transfer is performed wholly within the system, the fact that the proposed technology arranges the heat sink outside the system, i.e., using an external heatsink allows or enables a selective use that depend on the actual system conditions. This will be particularly useful in radio access cases where the radio heads or radio units are densely packed with heat generating components and the environment is not providing enough cooling. The cooling mechanisms is obtained by physically attaching heat transferring structures to the fiber optical transceiver module and allowing the heat transferring structures to connect, at the opposite end, to a heat sink that is provided outside of the RRU that is housing the fiber optical transceiver module. Particular embodiments of the heat transferring structure such as embodiment comprising heat pipes connected to the laser, or thermal pads interfacing the optical pluggable case will be described in what follows.

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

An embodiment of the proposed technology provides a Remote Radio Unit wherein the fiber optical transceiver module 100 further comprises a Receiver Optical Sub-Assembly, ROSA having an input adapted to receive an optical signal. Even though the ROSA input today typically contributes small amounts of generated heat, the proposed embodiment makes it possible to remove even this heat from the RRU environment.

Figure 4:
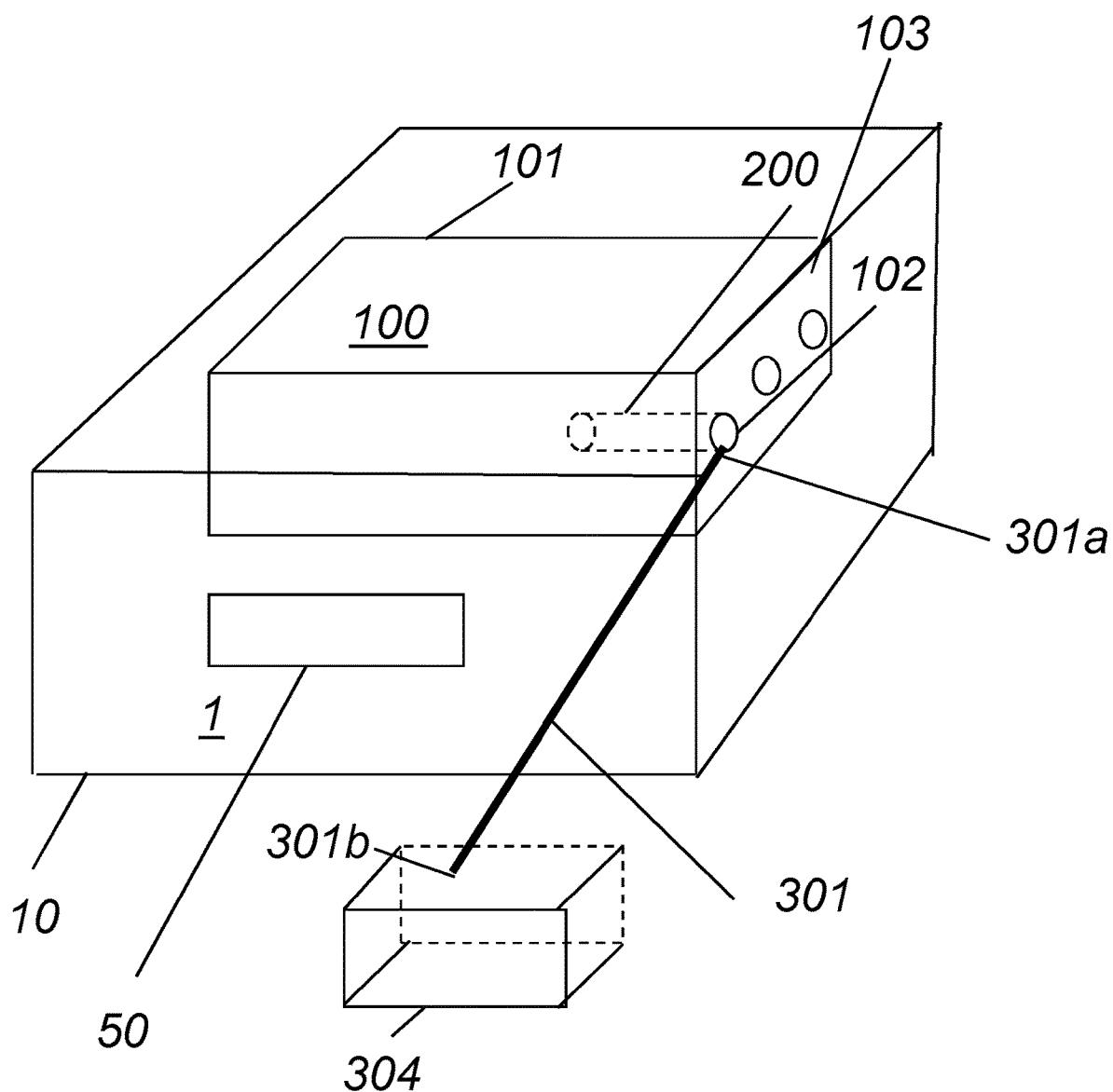
FIG. 4 is a schematic illustration of an RRU comprising a fiber optical transceiver module according to an alternative embodiment of the proposed technology.

According to a particular embodiment of the proposed technology there is provided a Remote Radio Unit 1, wherein the heat transferring structure comprises thermal conductors 301 having one end 301a connected to the output of the TOSA 200 and optionally to the input of the ROSA and having an opposite end 301b connected to the heat sink 304 arranged outside the outer shell 10. This embodiment is schematically illustrated in FIG. 4. This embodiment specifies that thermal conductors extend between the TOSA output/ROSA input, where there is reason to believe that excessive heat is present, and an external heat sink.

Figure 5:
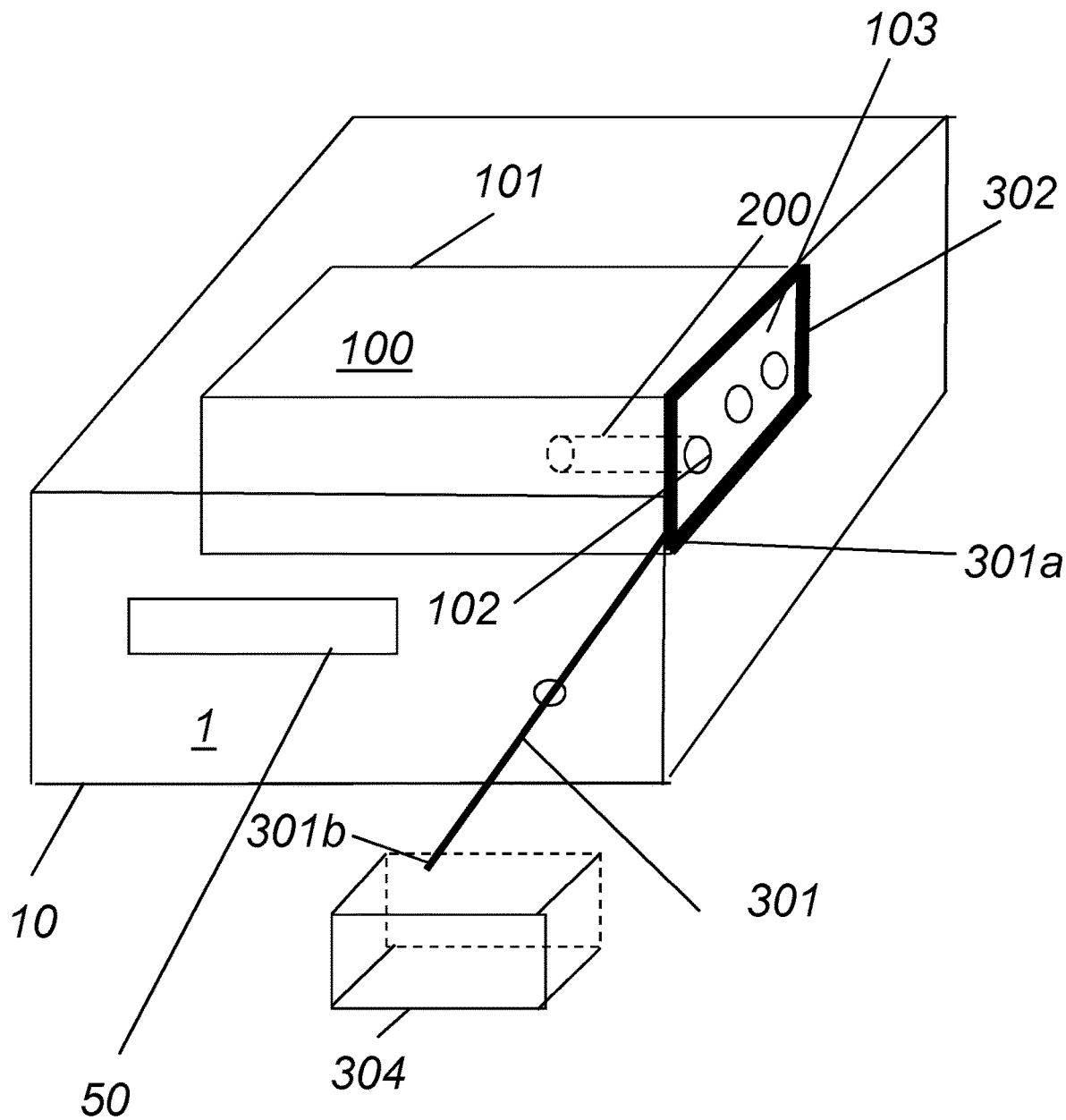
FIG. 5 is a schematic illustration of an RRU comprising a fiber optical transceiver module according to an alternative embodiment of the proposed technology.

According to yet another embodiment of the proposed technology there is provided a Remote Radio Unit 1, wherein the heat transferring structure 300 comprises thermal pads 302 attached to at least part of the interface 103 of the casing 101. The thermal pads 302 being connected to thermal conductors 301 adapted to transfer heat from the thermal pads to the heat sink 304 arranged outside the outer shell 10. This embodiment is schematically illustrated in FIG. 5. Thermal pads, which are frequently also referred to as thermally conductive pads, thermal pads, thermally conducting elements, or even thermal interface pads, are pieces or slabs of solid material that are attached to electronic components for cooling purposes. The thermal pads are often provided with a square shaped geometry or as a rectangular piece of material such as silicone containing material adapted to be attached to an electronic component and connected to a heat sink. They may however have any shape tailored to the particular application.

Figure 6:
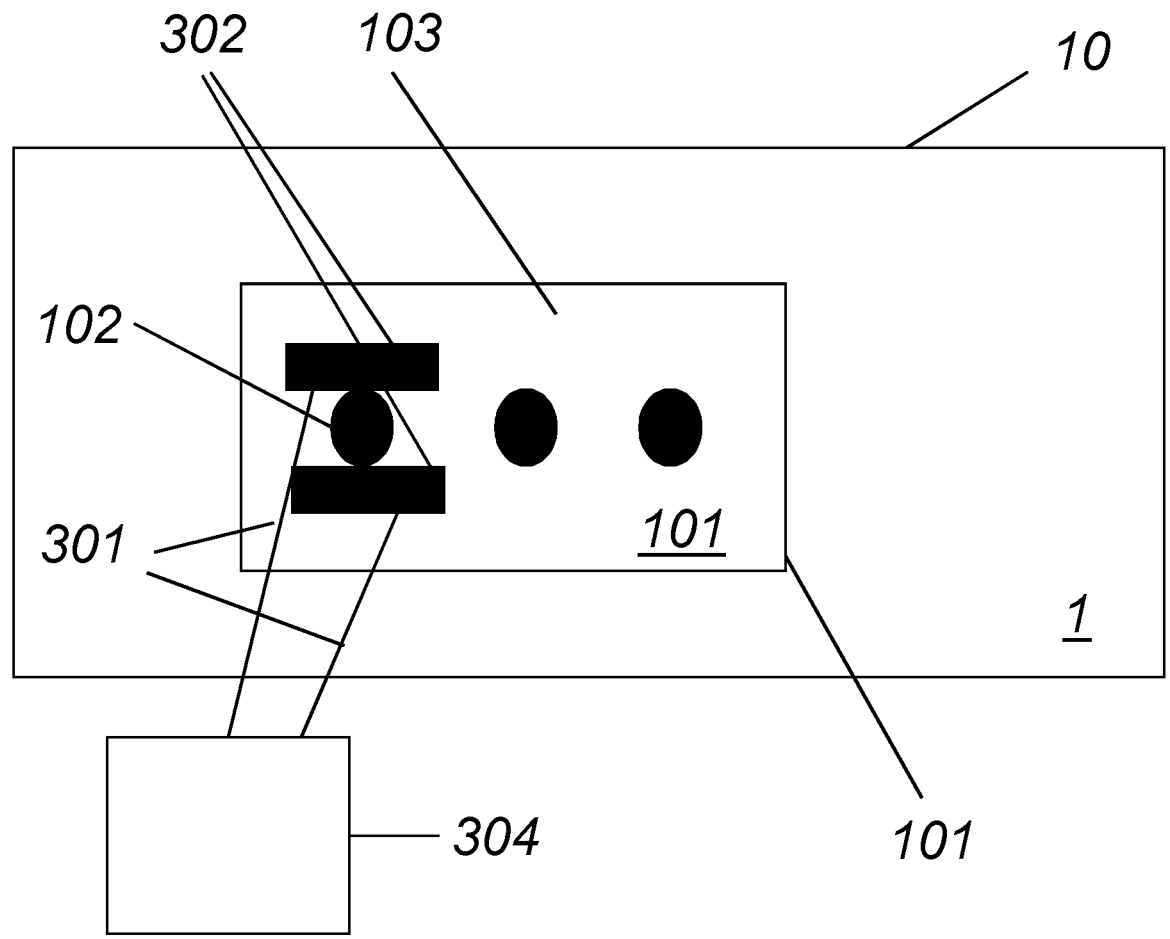
FIG. 6 is a schematic illustration of an RRU comprising a fiber optical transceiver module according to an alternative embodiment of the proposed technology.
Figure 7:
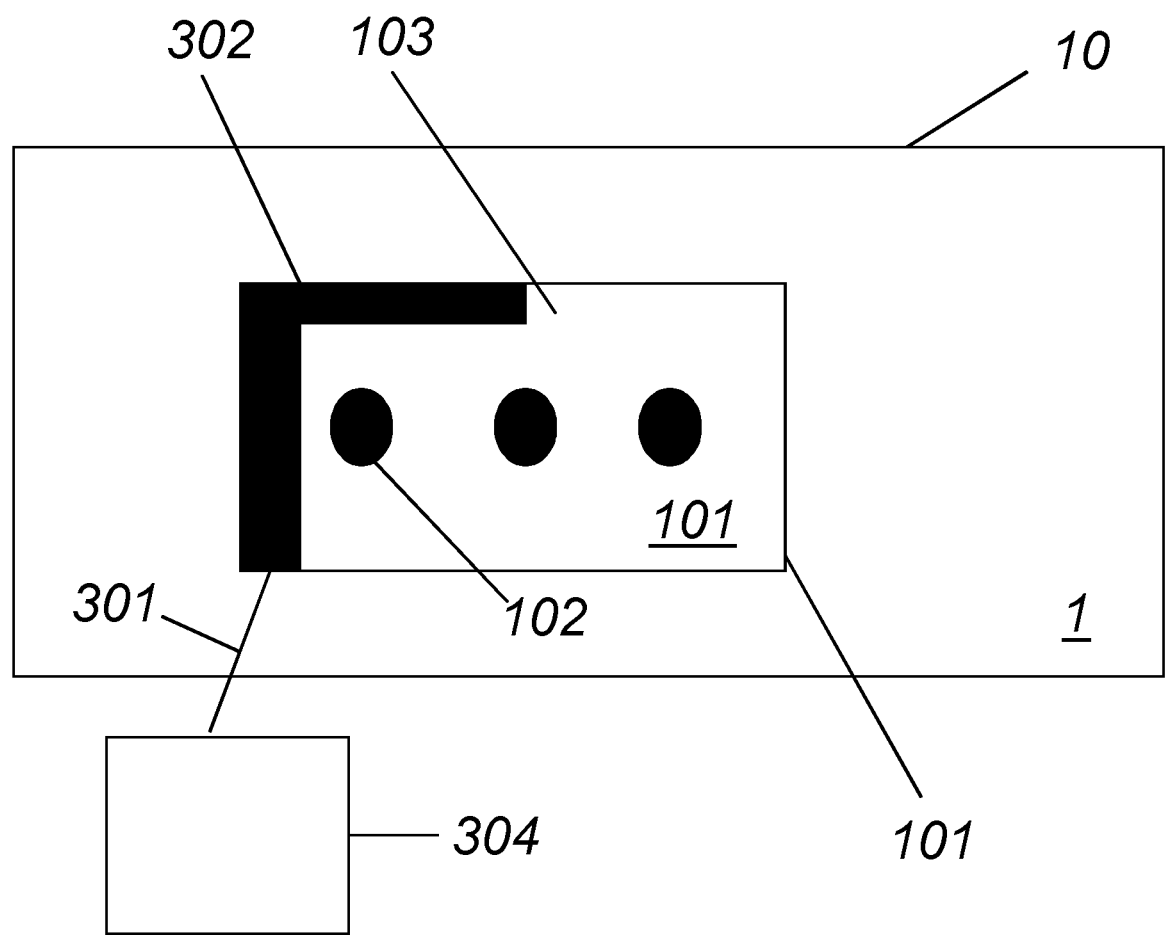
FIG. 7 is a schematic illustration of an RRU comprising a fiber optical transceiver module according to yet another alternative embodiment of the proposed technology.

Still another embodiment of the proposed technology provides a Remote Radio Unit 1, wherein the heat transferring structure 300 comprises thermal pads 302 arranged around the output of the TOSA 200 and optionally to the input of the ROSA, and at least one thermal conductor 301 having one end 301a connected to a corresponding thermal pad 302 and having an opposite end 301b connected to the heat sink 304 arranged outside the outer shell 10. FIG. 5 provides a schematic illustration of such an RRU. FIG. 6 is a schematic illustration of an RRU 1 as seen from the front of the fiber optical transceiver module interface. The RRU comprises an outer housing 10 enclosing a fiber optical transceiver module 100 having a casing 101, fiber optical transceiver module interface 103, a transmitter output 102 for a TOSA, e.g., a laser output. Also shown are thermal pads 302 arranged above and under the transmitter output 102 and connected to thermal conductors 301. These thermal conductors 301 can for example be collocated or part of the fiber optic cable and connector that is used to connect to the TOSA. Heat pipes 301 extend between the thermal pads 302 and the heat sink 304, arranged outside the housing 10 of the RRU 1. It is shown how a single transmitter output is provided with thermal pads. If there are more than one transmitter output, they could all be fitted with thermal pads 302. FIG. 7 provides a schematic illustration of an alternative embodiment where the thermal pads 302 are arranged on the casing 101 of the fiber optical transceiver module 100. The thermal pads 302 can be arranged on a section of the periphery of the interface 103, as shown in FIG. 7, but they can also be provided so that they extend around the whole periphery of the interface 103, as shown in e.g., FIG. 5.

By way of example, the proposed technology provides a Remote Radio Unit, wherein the thermal conductors 301 comprises heat pipes. A heat pipe is a well-known and highly effective device for transferring heat from hot spots or areas. It effectively works by combining thermal conductivity effects and phase transition effects to enable a transfer of heat between two or more locations. A heat pipe work by allowing a liquid that is in contact with a thermally conductive solid surface that form the interface of the heat pipe that is exposed to the heat to vaporize by absorbing the heat from the interface surface. The obtained vapor is then allowed to travel along the heat pipe to a cooler interface where the vaporized liquid condensates back into a liquid with the result that the latent heat is released. This is then repeated whereby heat is transferred from the environment surrounding the thermally conductive solid surface the releasing the latent heat.

A specific embodiment of the proposed technology provides a Remote Radio Unit 1, wherein the fiber optical transceiver module 100 is a small form factor pluggable, SFP, transceiver adapted to be inserted into the Remote Radio Unit 1. An RRU 1 may comprise a fiber optical transceiver module as a fixed, that is, a non-pluggable feature, but the most common option is to have an optical pluggable, e.g., a SFP, that is adapted to perform the actions of the fiber optical transceiver module.

Yet another embodiment of the proposed technology provides a Remote Radio Unit 1 wherein the heat transferring structure is adapted to transfer heat generated in the fiber optical transceiver module 100 to a heat sink 304 arranged outside the outer shell 10 through an opening provided in the outer shell 10.

As was mentioned above, there are certain scenarios where the fiber optical transceiver module of the RRU is a removable module that may be in the form of a SFP. In order to facilitate a swift connection of a removable module, such as an SFP, to a heat sink, the proposed technology also provides a fiber optical transceiver module provided with heat transferring structures 302 that may preferably be used with a Remote Radio Unit. The heat transferring structures provided on the removable module are to be connected to an external heat sink via heat guides or heat pipes in order to transfer heat generated by the module to the heat sink. The fiber optical transceiver module is designed so that it can inserted into a Remote Radio Unit and be connected to a heat sink that is preferably arranged outside the Remote Radio Unit.

Figure 8A:
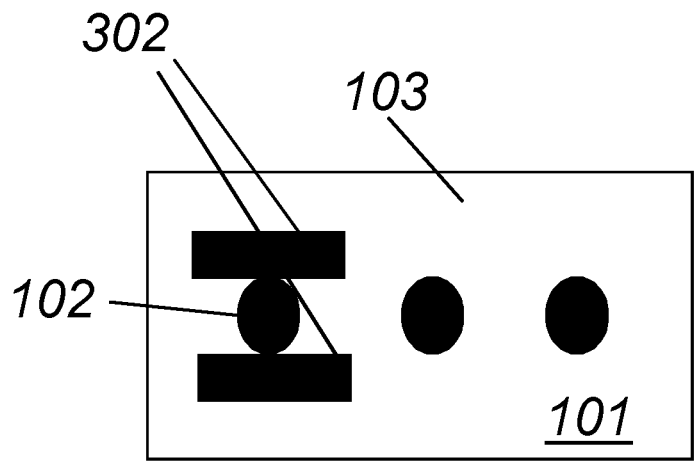
FIG. 8a is a schematic illustration of a fiber optical transceiver module according to the proposed technology.

To this end the fiber optical transceiver module 100 comprises a casing 101 provided with an interface 103 having a transmitter output 102 and a Transmitter Optical Sub-Assembly, TOSA arranged within the casing 101 and adapted to transmit light through the transmitter output 102. The casing 101 of the fiber optical transceiver module is further provided with thermal pads 302 arranged on the surface of the casing 101, where the thermal pads are adapted to connect to a thermal conductor. The thermal conductor should preferably extend between the thermal pads 302 and a heat sink arranged outside the Remote Radio unit. FIG. 8*a* provides an illustration of such a fiber optical transceiver module where the thermal pads 302 are provided on opposite sides of the transmitter output for the TOSA, e.g., on the opposite sides of the laser output.

Figure 8B:
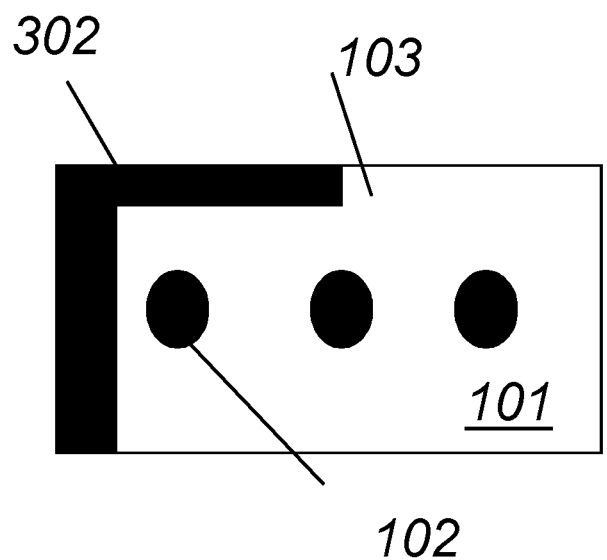
FIG. 8b is a schematic illustration of a fiber optical transceiver module according to the proposed technology.
Figure 8C:
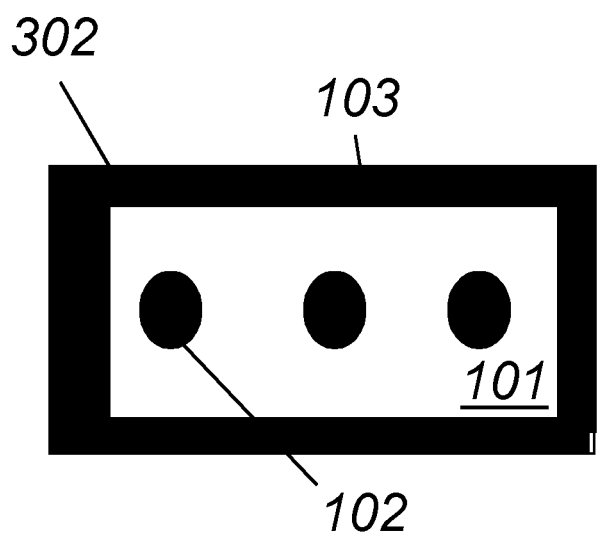
FIG. 8c is a schematic illustration of a fiber optical transceiver module according to the proposed technology.

A particular version of the fiber optical transceiver module 100 according to the proposed technology, provides a fiber optical transceiver module 100 where the thermal pads 302 are arranged on the interface 103 of the casing 101. That is to say, on the surface where the module is inserted into the Remote Radio Unit. A particular version of this embodiment is schematically illustrated in FIG. 8*b* where the thermal pads are arranged along a section of the outer boundary of the interface. FIG. 8*c* provide an illustration of an alternative fiber optical transceiver module where the thermal pads instead extend around the whole outer boundary of the interface 103.

As used herein, the term "base station" may encompass different types of radio base stations including standardized base station functions such as Node Bs, or evolved Node Bs (eNBs), gNodeBs, and also macro/micro/pico radio base stations, home base stations, also known as femto base stations, relay nodes, repeaters, radio access points, Base Transceiver Stations (BTSs), and even radio control nodes controlling one or more Remote Radio Units (RRUs), or the like.

As used herein, the non-limiting terms "wireless communication device", "station", "User Equipment (UE)", and "terminal" or "terminal device" may refer to a mobile phone, a cellular phone, a Personal Digital Assistant (PDA), equipped with radio communication capabilities, a smart phone, a laptop or Personal Computer (PC), equipped with an internal or external mobile broadband modem, a tablet with radio communication capabilities, a target device, a Machine-to-Machine (M2M) device, a Machine Type Communication (MTC) device, an Internet of Thing (IoT) device, a Device-to-Device (D2D) UE, a machine type UE or UE capable of machine to machine communication, Customer Premises Equipment (CPE), Laptop Embedded Equipment (LEE), Laptop Mounted Equipment (LME), USB dongle, a portable electronic radio communication device, and/or a sensor device, meter, vehicle, household appliance, medical appliance, camera, television, radio, lightning arrangement and so forth equipped with radio communication capabilities or the like. In particular, the term "wireless communication device" should be interpreted as non-limiting terms comprising any type of wireless device communicating with a network node in a wireless communication system and/or possibly communicating directly with another wireless communication device. In other words, a wireless communication device may be any device equipped with circuitry for wireless communication according to any relevant standard for communication.

The invention claimed is:

1. A remote radio unit, RRU, having an outer shell housing radio equipment and at least one fiber optical transceiver module, said fiber optical transceiver module comprising:

a casing provided with an interface having a transmitter output; and a Transmitter Optical Sub-Assembly, TOSA, arranged within said casing, said TOSA being adapted to transmit light through said transmitter output, wherein said fiber optical transceiver module is physically attached to a heat transferring structure adapted to transfer heat generated in said fiber optical transceiver module to a heat sink arranged outside said outer shell.

2. The remote radio unit according to claim 1, wherein said fiber optical transceiver module further comprises a Receiver Optical Sub-Assembly, ROSA, having an input adapted to receive an optical signal.

3. The remote radio unit according to claim 1, wherein said heat transferring structure comprises thermal conductors having one end connected to the output of said TOSA and/or to the input of said ROSA and having an opposite end connected to said heat sink arranged outside said outer shell.

4. The remote radio unit according to claim 1, wherein said heat transferring structure comprises thermal pads attached to at least part of said interface of said casing, said thermal pads being connected to thermal conductors adapted to transfer heat from said thermal pads to said heat sink arranged outside said outer shell.

5. The remote radio unit according to claim 1, wherein said heat transferring structure comprises thermal pads arranged around said output of said TOSA and/or around the input of said ROSA, and at least one thermal conductor having one end connected to a corresponding thermal pad and having an opposite end connected to said heat sink arranged outside said outer shell.

6. The remote radio unit according to claim 1, wherein said thermal conductors comprises heat pipes.

7. The remote radio unit according to claim 1, wherein said fiber optical transceiver module is a small form factor pluggable transceiver adapted to be inserted into said remote radio unit.

8. The remote radio unit according to claim 1, wherein the heat transferring structure is adapted to transfer heat generated in said fiber optical transceiver module to a heat sink arranged outside said outer shell through an opening provided in said outer shell.

9. A fiber optical transceiver module comprising a casing provided with an interface having a transmitter output and a Transmitter Optical Sub-Assembly, TOSA, arranged within said casing and adapted to transmit light through said transmitter output, wherein said casing is further provided with thermal pads arranged on the surface of said casing, said thermal pads being adapted to connect to a thermal conductor.

10. The fiber optical transceiver module according to claim 9, wherein said thermal pads are arranged on the interface of said casing.

* * * * *